(12) United States Patent
Kanna (10) Patent No.: US 7,696,675 B2
(45) Date of Patent: Apr. 13, 2010

(54) SURFACE ACOUSTIC WAVE DEVICE AND ELECTRONIC APPARATUS

(75) Inventor: Shigeo Kanna, Nagano-ken (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/704,103

(22) Filed: Feb. 6, 2007

(65) Prior Publication Data

US 2010/0001617 A9    Jan. 7, 2010

(30) Foreign Application Priority Data

Feb. 6, 2006   (JP)   ............... 2006-028028

(51) Int. Cl.
*H03H 9/64*   (2006.01)
*H03H 9/25*   (2006.01)

(52) U.S. Cl. .................... 310/361; 333/193; 333/195; 310/313 B; 310/313 D (58) Field of Classification Search ................. 310/358, 310/313

See application file for complete search history.

(56) References Cited

U.S. PATENT DOCUMENTS

| | | | |
|---|---|---|---|
| 4,249,146 A | | 2/1981 | Yen et al. |
| 4,760,359 A | | 7/1988 | Shiba et al. |
| 7,245,193 B2 * | | 7/2007 | Funasaka .................... 333/193 |
| 7,358,832 B2 * | | 4/2008 | Takamine .................... 333/193 |
| 2003/0030513 A1 * | | 2/2003 | Yamazaki et al. ........... 333/195 |

FOREIGN PATENT DOCUMENTS

| DE | 37 00 498 A1 | 7/1987 |
|---|---|---|
| EP | 0 977 356 A1 | 2/2000 |
| EP | 1406385 | 4/2004 |
| EP | 1659687 | 5/2006 |
| JP | 63-088910 | 4/1988 |
| JP | 11-220352 | 8/1999 |
| JP | 2002-100959 | 4/2002 |
| JP | 2002-100959 | 5/2002 |
| JP | 2005-086233 | 3/2005 |
| JP | 2005-102182 | 4/2005 |

OTHER PUBLICATIONS

Extended European Search Report.
Y. Yong et al., XP-002366731 La Grangean Temperature Coefficients of the Piezoelectric Stress Constants and Dielectric Permittivity of Quartz.

(Continued)

*Primary Examiner*—J. SanMartin
(74) *Attorney, Agent, or Firm*—Baker & Hostetler, LLP

(57) ABSTRACT

A surface acoustic wave device includes: a quartz substrate; and at least a single-type IDT electrode provided on a surface of the quartz substrate for exciting a Rayleigh surface acoustic wave in the upper limit mode of the surface acoustic wave stop band with the following relationships satisfied;

$\phi=0°$, $110° \leq \theta \leq 140°$, and $38° \leq |\psi| \leq 44°$, when the quartz substrate cut angles and the surface acoustic wave propagation direction are represented by Euler angles ($\phi, \theta, \psi$), and wherein the electrode thickness relative to wavelength set such that $H/\lambda \geq 0.1796\eta^3 - 0.4303\eta^2 + 0.2071\eta + 0.0682$, with the thickness of the IDT electrode defined as H, the width of an electrode IDT finger defined as d, the pitch between the electrode fingers of the IDT electrode as P, the wavelength of the surface acoustic wave as $\lambda$, and where $\eta=d/P$.

2 Claims, 10 Drawing Sheets

OTHER PUBLICATIONS

Part 1, No. 5B, May 2003 Temperature Stability of Surface Acoustic Wave Resonators on In-Plane Rotated 33 degrees Y-Cut Quartz, C.S. Lam et al., Dec. 14, 2004.

The Institute of Electronics, Information and Communication Engineers, Technical Report of IEICE, US99-20(Jun. 1999) Frequency-Temperature Analysis of Surface Acosutic Waves USing Finite Element Method, Kanna et al., Jun. 1999.

XP-002366726 A Review of the Recent Development of Temperature Stable Cuts of Quartz for SAW Applications, Yamazaki et al., May 2003.

* cited by examiner

SURFACE ACOUSTIC WAVE DEVICE AND ELECTRONIC APPARATUS

BACKGROUND

1. Technical Field

The present invention relates to a surface acoustic wave device using the upper limit mode of the stop band of Rayleigh surface acoustic waves.

2. Related Art

Surface acoustic wave devices such as SAW resonators or SAW filters, features higher frequencies, smaller sizes, and mass production capability, having widely been used in the field of communications. In particular, surface acoustic wave devices using a quartz substrate such as ST-cut quartz substrates shows high temperature stability featured by a quartz crystal so as to attain higher accuracy. As the use of portable communications apparatuses spread in recent years, those surface acoustic wave devices are further required to achieve higher frequencies and smaller sizes as well as higher temperature stability and thereby higher accuracy.

It is known that two frequency solutions called "stop band" can be calculated with respect to a Rayleigh surface acoustic wave excited by an interdigital transducer (IDT) electrode provided on a piezoelectric substrate made of a crystal or the like. Either of these frequency solutions, that is, the lower frequency (lower limit mode) and the higher frequency (upper limit mode) is used in excitation. It is known that when an ST-cut quartz substrate includes a single-type IDT electrode having two electrode fingers in one wavelength of a surface acoustic wave, surface acoustic waves are excited in the lower limit mode of the stop band. In the meantime, as shown in the Technical Report of the Institute of Electronics, Information and Communication Engineers (IEICE), US99-20 (1999-06), pp. 37-42 (FIG. 4), when comparing the lower and upper limit modes, the upper limit mode shows a smaller absolute value of the second-order temperature coefficient of the frequency temperature characteristic (frequency variation characteristic with the temperature). The upper limit mode also shows a smaller variation (smaller increase or decrease) in the absolute value of the second-order temperature coefficient when the thickness of the IDT electrode is increased. Therefore, it is understood that a better frequency temperature characteristic is exhibited in the upper limit mode and that the upper limit mode is more suitable to obtaining higher frequencies. However, a single-type IDT electrode on the ST-cut quartz substrate can excite no surface acoustic wave in the upper limit mode.

Figure 11A:
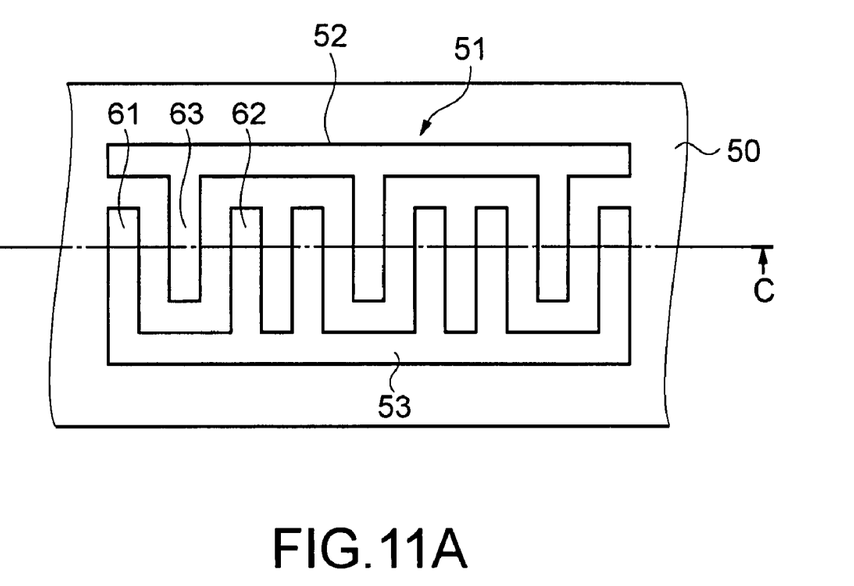
FIG. 11A is a schematic plan view.
Figure 11B:
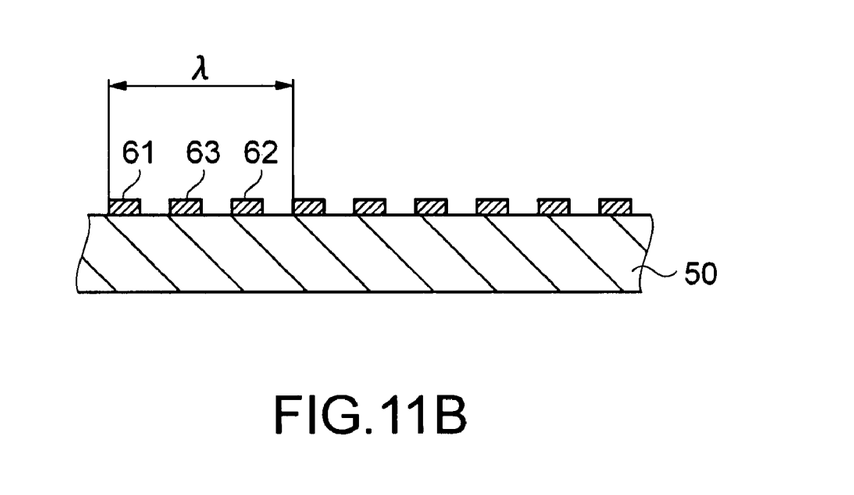
FIG. 11B is a schematic sectional view taken along line C-C of FIG. 11A.

Thus, as means for exciting surface acoustic waves in the upper limit mode of the stop band, there has been proposed a surface acoustic wave device including a reflection/inversion type IDT electrode as shown in JP-A-2002-100959 (FIG. 13). FIGS. 11A and 11B of the subject application show the configuration of a surface acoustic wave device including a reflection/inversion type IDT electrode; FIG. 11A is a schematic plan view, and FIG. 11B is a schematic cross sectional view taken along line C-C of FIG. 11A. In a reflection/inversion type IDT electrode 51, electrodes 52 and 53 are configured with its electrode fingers 61, 62, and 63 disposed as if to be engaged to each other. According to this configuration, three electrode fingers 61, 62, and 63 are provided in one wavelength λ of a surface acoustic wave, with the electrode fingers 61,62 and 63 driven in opposite phases.

Further, in order to improve the frequency temperature characteristic when using an ST-cut quartz substrate in a surface acoustic wave device, it is known to use an in-plane rotation ST-cut quartz substrate as taught in "Temperature Stability of Surface Acoustic Wave Resonators on In-Plane Rotated 33° Y-Cut Quartz," JJAP Vol. 42 (2003), pp. 3136-3138. According to this document, the frequency variation is about 59 ppm when Euler angles are (0°, 123°, 43.4°), the second-order temperature coefficient in the lower limit mode of the stop band is $-1.4 \times 10^{-8}$ (1/° $C.^2$), and the temperature is in the range of −40° C. to 90° C.

However, the reflection/inversion type IDT electrode includes three electrode fingers in one wavelength. Therefore, in order for a surface acoustic wave device using an IDT electrode of such a type to achieve higher frequencies, it is necessary to make the width of the IDT electrode even smaller than that of a single-type IDT electrode, which commonly includes two electrode fingers in one wavelength of a surface acoustic wave. This places a burden on the manufacturing process, making it difficult for a surface acoustic wave device using a reflection/inversion type IDT electrode to achieve higher frequencies.

Further, even when using an in-plane rotation ST-cut quartz substrate in a surface acoustic wave device in order to improve the frequency temperature characteristic to achieve higher accuracy, the frequency variation is about 59 ppm at best in the temperature range of −40° C. to 90° C.

SUMMARY

An advantage of the invention is to provide a surface acoustic wave device that shows an excellent frequency temperature characteristic and can readily achieve higher frequencies by using a single-type IDT electrode and utilizing the upper limit mode of the stop band as the oscillation frequency.

According to one embodiment of the subject invention, a surface acoustic wave device includes: a quartz substrate; and at least a single-type IDT electrode provided on a surface of the quartz substrate for exciting a Rayleigh surface acoustic wave in an upper limit mode of a stop band of the surface acoustic wave when the following relationships are satisfied;

$\phi=0°$, $110° \leq \theta \leq 140°$, and $38° \leq |\psi| \leq 44°$, with the quartz substrate having cut angles and a surface acoustic wave propagation direction represented by Euler angles ($\phi$, $\theta$, $\psi$).

In addition the electrode thickness to wavelength should be set such that the relationship $H/\lambda \geq 0.1796\eta^3 - 0.4303\eta^2 + 0.2071\eta + 0.0682$ is satisfied wherein the thickness of the IDT electrode is defined as H, the width of an electrode finger of the IDT electrode is defined as d, the pitch between the electrode fingers of the IDT electrode is defined as P, the wavelength of the surface acoustic wave is defined as λ, and where $\eta=d/P$.

The cut angles of the quartz substrate allow the surface acoustic wave propagation direction to be moved to a position distant from a symmetric position with respect to the quartz crystal in the quartz substrate. This makes it possible to utilize the upper limit mode of the stop band as the oscillation frequency of surface acoustic wave. Setting H/λ as described above allows the single-type IDT electrode to excite surface acoustic waves more strongly in the upper limit mode than in the lower limit mode. According to this configuration, it is possible to provide a surface acoustic wave device that has a smaller frequency variation with the temperature than when using an in-plane rotation ST-cut quartz substrate and can readily achieve higher frequencies for its use of a single-type IDT electrode.

The surface acoustic wave device according to one aspect of the invention preferably further includes a reflector on both sides of the IDT electrode, wherein when the pitch between electrode fingers of the IDT electrode is defined as P and the pitch between electrode fingers of the reflector as Pr, the variables P and Pr have a relation of P/Pr>1.

This makes it possible to make the peak frequency of the radiation conductance of the IDT electrode and the peak frequency of the reflection coefficient of the reflector come close to each other in the upper limit mode. This, on the other hand, makes it possible for these peak frequencies in the lower limit mode to be a substantial distance apart. In other words, it is possible to excite surface acoustic waves more strongly in the upper limit mode and less strongly in the lower limit mode. Moreover, it is possible to excite surface acoustic waves more strongly in the upper limit mode of the stop band edges.

An electronic apparatus of the subject invention includes the above described surface acoustic wave device and is configured to excite surface acoustic waves more strongly in the upper limit made to achieve an excellent frequency temperature characteristic.

BRIEF DESCRIPTION OF THE DRAWINGS

The invention will be described with reference to the accompanying drawings, wherein elements with like reference numbers correspond to like elements.

FIGS. 5A and 5B are graphs showing conditions in which the respective frequency differences in the upper and lower limit modes exceed each other.

FIGS. 6A and 6B are drawings showing the configuration of an SAW resonator according to a second embodiment of the invention.

FIGS. 11A and 11B are drawings showing a related-art reflection/inversion type IDT electrode.

DESCRIPTION OF EXEMPLARY EMBODIMENTS

Embodiments of the invention will now be described with reference to the accompanying drawings. To begin with, description will be made on Euler angles (φ, θ, ψ) to specify the cut angles of, a quartz substrate and the surface acoustic wave propagation direction.

Figure 1:
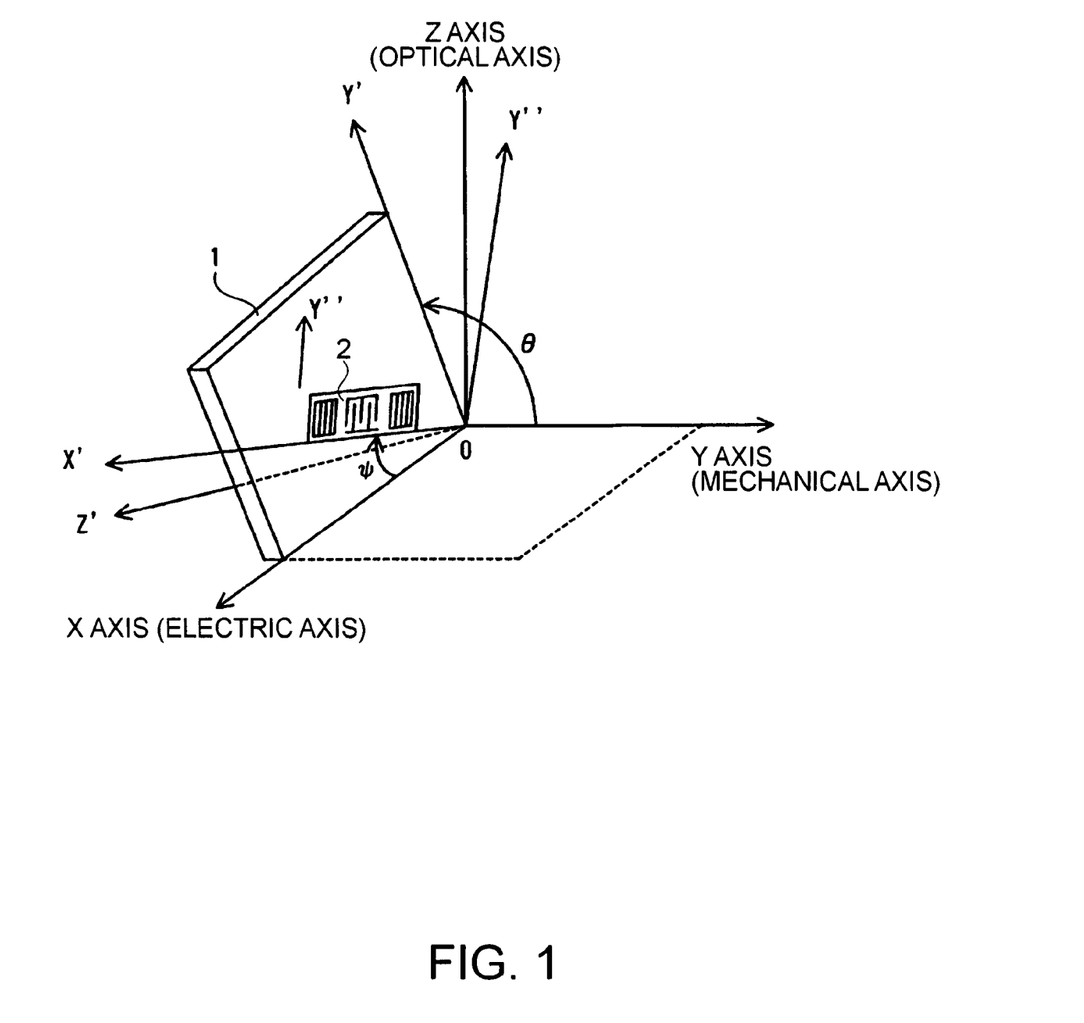
FIG. 1 is a drawing showing Euler angles.

FIG. 1 is a drawing showing Euler angles. The crystal axes of a quartz crystal are defined by the X axis (electric axis), Y axis (mechanical axis), and Z axis (optical axis). Euler angles (0°, 0°, 0°) represent a quartz plate perpendicular to the Z axis. In this invention, the angle φ at which the X and Y axes are rotated with the Z axis as the rotation axis is fixed as φ=0°.

When the Y axis and the Z axis are rotated counterclockwise by the angle θ with the X axis as the rotation axis, newly generated coordinate axes are defined to be the Y' axis and Z' axis, respectively. What is formed by cutting a quartz crystal in a plane direction including the X and Y' axes with the Z' axis as the normal is defined as a quartz substrate 1. When the X and Y' axes are rotated by ψ with the Z' axis as the rotation axis in the quarts substrate 1 cut in this plane direction, newly generated coordinate axes are defined as the X' and Y" axes, respectively. The X' axis is defined as the surface acoustic wave propagation direction of the surface acoustic wave device 2. The angle ψ in the quartz substrate 1 is called the in-plane rotation angle. As described above, the cut angles of the quartz substrate and the surface acoustic wave propagation direction can be represented and specified by Euler angles (φ, θ, ψ).

First Embodiment

Figure 2A:
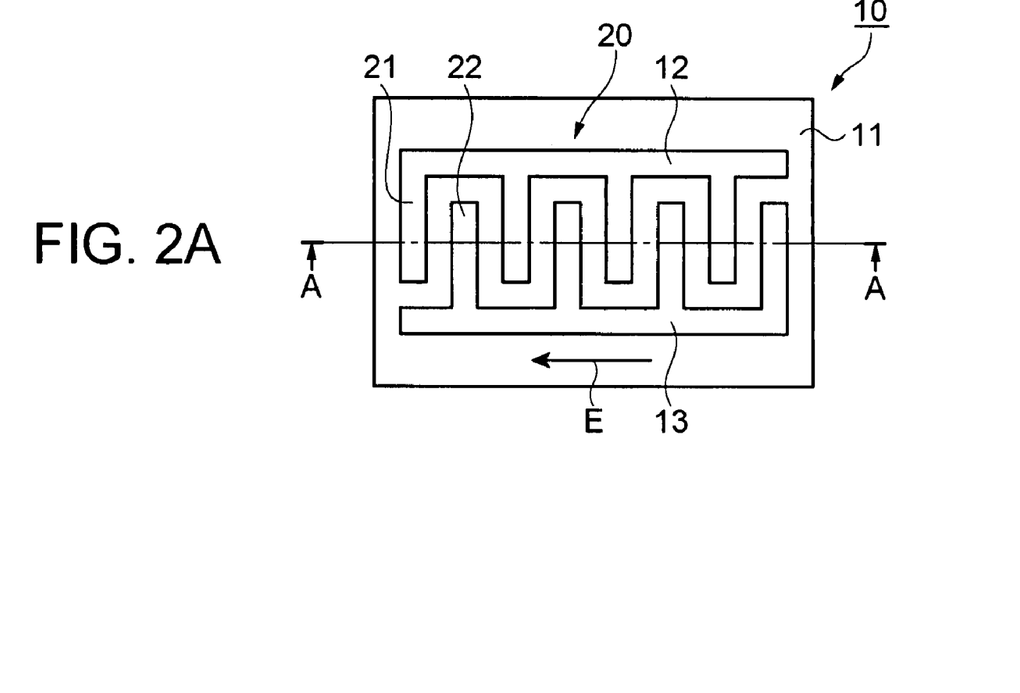
FIGS. 2A and 2B are drawings showing the configuration of an SAW resonator according to a first embodiment of the invention; with FIG. 2A being a schematic plan view of the SAW resonator, and FIG. 2B being a schematic sectional view taken along line A-A of FIG. 2A.
Figure 2B:
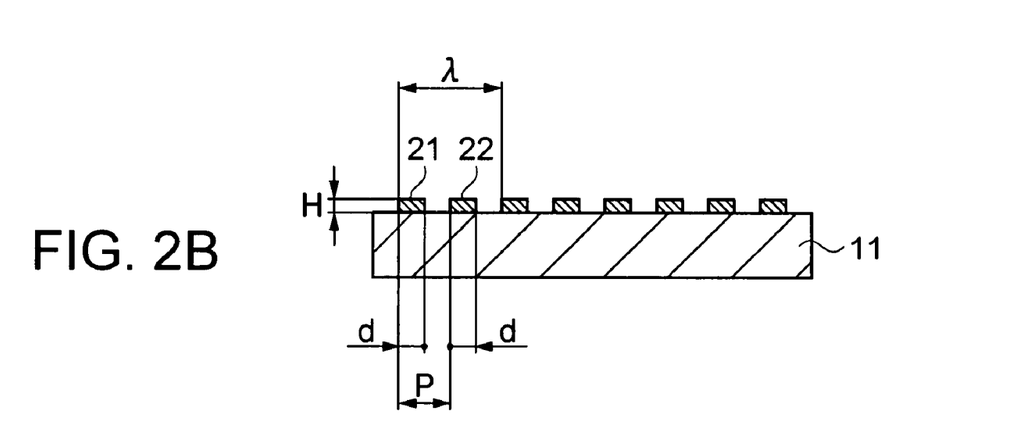

An embodiment of the invention will now be described with an SAW resonator as an example of a surface acoustic wave device. FIGS. 2A and 2B are schematic views of an SAW resonator including a single-type IDT electrode and serving as a surface acoustic wave device. FIG. 2A is a schematic plan view of the SAW resonator, and FIG. 2B is a schematic sectional view taken along line A-A of FIG. 2A.

A SAW resonator 10 has an IDT electrode 20 provided on a surface of a quartz substrate 11. The IDT electrode 20 includes an electrode 12 having multiple electrode fingers 21 and an electrode 13 having multiple electrode fingers 22. The electrode fingers 21 and 22 are disposed as if to be engaged with each other, and are formed with a thickness H and an electrode width d. Pitches P between the electrode fingers 21 and 22 are continuously formed in equal lengths. One electrode finger 21 and one electrode finger 22 are provided in one wavelength λ of a surface acoustic wave. The IDT electrode 20 thus configured is generally called a single-type IDT electrode. The IDT electrode 20 is composed of Al. The electrode fingers 12 and 13 are driven so as to be in opposite phases. The quartz substrate 11 is cut out of a quartz crystal at Euler angles (0°, 0°≦θ≦180°, 0°<|ψ|<90°). The direction of the arrow E matches the X' axis that is the surface acoustic wave propagation direction described in FIG. 1.

Among related-art ST-cut quartz substrates is, for example, one cut out at Euler angles (0°, 123°, 0°). When an SAW resonator includes this substrate and a single-type IDT electrode, surface acoustic waves are excited in the lower limit mode of the stop band. It is known that in which of the upper and lower limit modes of the stop band surface acoustic waves are excited depends on whether or not there is any difference in frequency between the short circuit condition and the open condition in each mode. In other words, it is known that surface acoustic waves are excited in a mode where there is such a frequency difference.

Table 1 shows differences in frequency between the short circuit condition and the open condition in the upper limit mode when using an ST-cut quartz substrate including a single-type IDT electrode as well as when using a quartz substrate cut out at the cut angles according to the present invention. Assuming that the wavelength λ of a surface acoustic wave=10 μm, Table 1 shows frequency differences under different conditions, that is, different normalized electrode widths η (d/P), and different normalized electrode thicknesses H/λ. The normalized electrode width η (d/P) is obtained by dividing the width d of the electrode finger by the pitch P of the electrode finger. The normalized electrode thickness H/λ is obtained by dividing the thickness H of the electrode finger by the wavelength λ. The frequency in the short circuit condition in the upper limit mode is defined as $f_{us}$, and the frequency in the open condition in the upper limit mode is defined as $f_{uo}$. The difference between $f_{us}$ and $f_{uo}$ is represented by the absolute value.

TABLE 1

| | Condition | $|f_{us} - f_{uo}|$ [MHz] (λ = 10 μm) |
|---|---|---|
| A | (0°, 123°, 0°) η = 0.5, H/λ = 0.03 | 0 |
| B | (0°, 123°, 0°) η = 0.7, H/λ = 0.10 | 0 |
| C | (0°, 123°, 41°) η = 0.5, H/λ = 0.03 | 0.0015 |
| D | (0°, 123°, 41°) η = 0.7, H/λ = 0.10 | 0.1667 |

Under the condition A of Table 1 where the ST-cut quartz substrate is used and η=0.5 and H/λ=0.03, the difference in frequency between the short circuit condition and the open condition in the upper limit mode is 0. Under the condition B where the ST-cut quartz substrate is used and η=0.7 and H/λ=0.10, the difference in frequency between the short circuit condition and the open condition in the upper limit mode is 0. Thus, it is understood that when the ST-cut quartz substrate is used, it is not possible to excite surface acoustic waves in the upper limit mode of the stop band even if the sizes of the electrode finger of the IDT electrode are changed.

Now the quartz substrate cut out at Euler angles (0°, 123°, 41°) used in the invention will be described as an example. Under the condition C where the quartz substrate cut out at the cut angles according to the invention is used and η=0.5 and H/λ=0.03, the difference in frequency between the short circuit condition and the open condition in the upper limit mode is 0.0015 MHz. Under the condition D where the quartz substrate cut out at the cut angles according to the invention is used as in the condition D and η=0.7 and H/λ=0.10, the difference in frequency between the short circuit condition and the open condition in the upper limit mode is 0.1667 MHz. Thus, it is understood that when the above described quartz substrate is used, it is possible to excite surface acoustic waves in the upper limit mode of the stop band. In other words, it is possible to excite surface acoustic waves in the upper limit mode by shifting the cut angles to make the symmetrical crystal structure of the quartz crystal asymmetrical.

Figure 3:
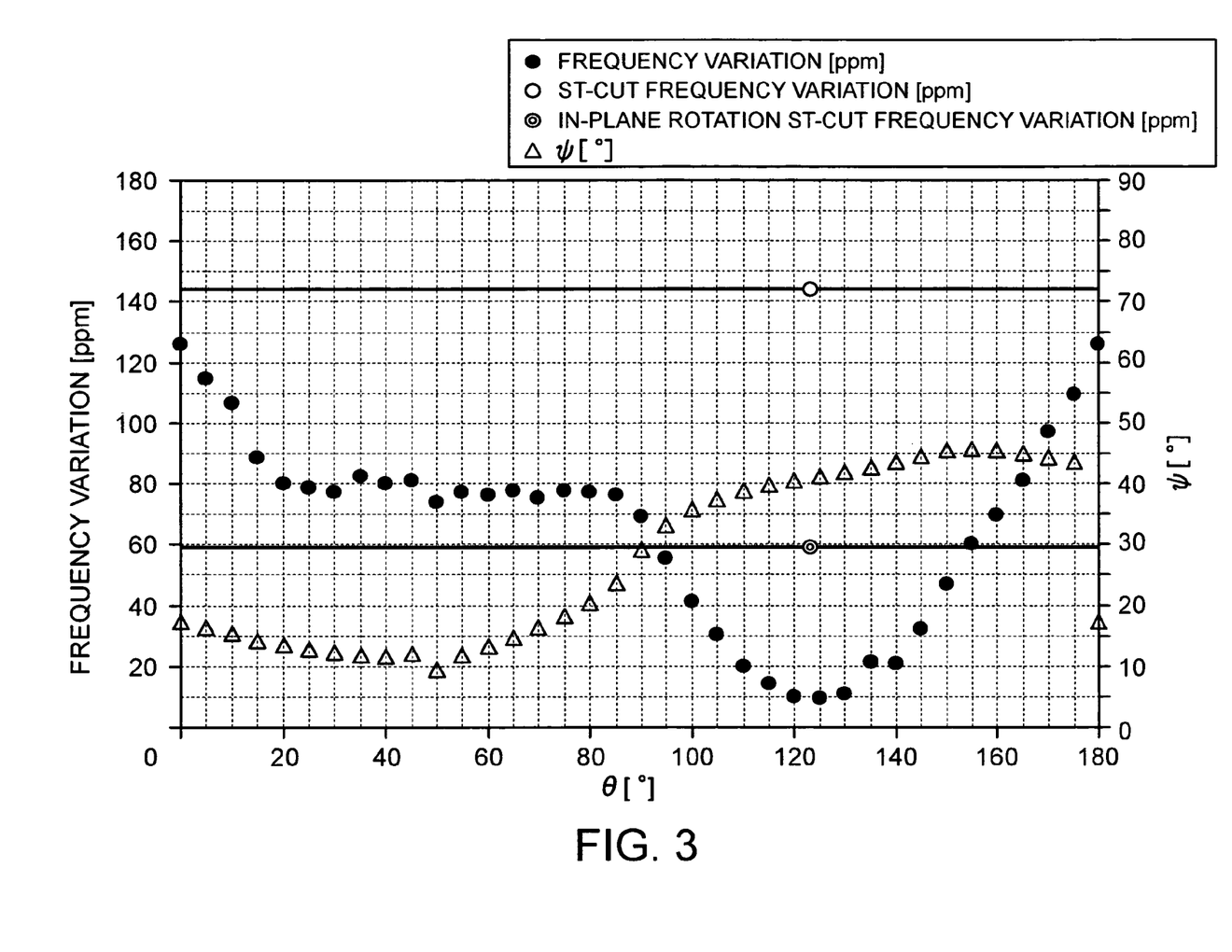
FIG. 3 is a graph showing frequency variations of the SAW resonator according to the first embodiment and cut angles θ and ψ of a substrate.

The following description of this invention will be made based on variations in frequency with temperature when the upper limit mode of the stop band is utilized and the quartz substrate cut out at preferred Euler cutting angles. FIG. 3 is a graph showing frequency variations with the temperature of the SAW resonator according to this embodiment. Here, frequency variation=maximum frequency deviation−minimum frequency deviation, and frequency deviation=(frequency at each temperature−frequency at temperature of 25° C.)/frequency at temperature of 25° C.

Further, it is assumed that the temperature range is −40° C. to 90° C., the normalized electrode width d/P of the single-type IDT electrode is 0.7, and the normalized electrode thickness H/λ of the single-type IDT electrode is 0.10. When the cut angle of the quartz substrate is fixed to φ=0° and the in-plane rotation angle ψ is changed in the range of 0° to 90° while changing θ in the range of 0° to 180°, frequency variations that are optimum values (minimum values) are represented by black circles. The corresponding in-plane rotation angles ψ are represented by triangles. For example, when ψ is changed in the range of 0° to 90° with φ=0° and θ=40°, the minimum frequency variation is about 80 ppm, and the corresponding in-plane rotation angle ψ is about 12°.

The same result can be obtained regardless of whether positive or negative angles are used for ψ because the quartz crystal has a symmetric crystal structure permitting either positive or negative angles to be used. It is also possible to use a quartz substrate cut out at cut angles crystallographically equivalent to the Euler angles.

Thus, in the quartz substrate having (0°, 0°≦θ≦180°, 0°<|ψ|<90°) as the cut angles and the surface acoustic wave propagation direction, it is possible to move the surface acoustic wave propagation direction to a position distant from a symmetric position with respect to the quartz crystal in the quartz substrate. This makes it possible to excite surface acoustic waves in the upper limit mode of the stop band using the single-type IDT electrode.

With regard to the frequency temperature characteristic, it is understood that with 0°≦θ≦180°, the frequency variation is smaller than when using an ST-cut quartz substrate, and with 95°≦θ≦155°, the frequency variation is smaller than when using an in-plane rotation ST-cut quartz substrate.

Here the inventor noticed the ranges of the Euler angles (0°, 110°≦θ≦140°, 38°≦|ψ|≦44°), which are cut angles that can have smaller frequency variations with the temperature than when using an in-plane rotation ST-cut quartz substrate. Then the inventor attempted to excite surface acoustic waves more strongly in the upper limit mode of the stop band to improve the characteristics of the SAW resonator. With the quartz substrate cut out at such cut angles, the frequency variations in the temperature range of −40° C. to 90° C. can be expected to be as small as about 10 to 20 ppm.

Figure 4:
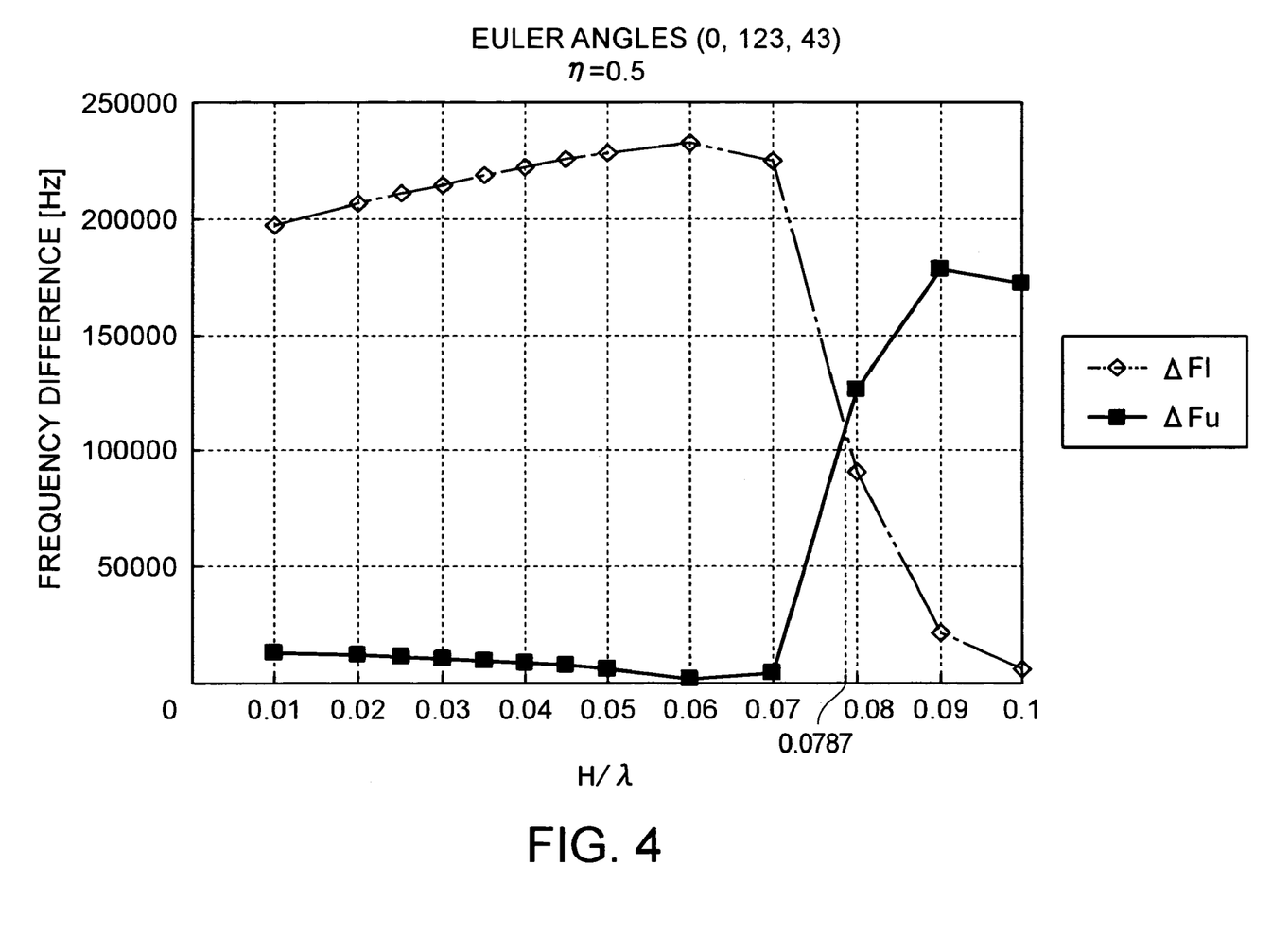
FIG. 4 is a graph showing differences in frequency between the open condition and the short circuit condition for each of the upper and lower limit modes of the stop band.

FIG. 4 is a graph showing differences in frequency between the open condition and the short circuit condition in each of the upper and lower limit modes of the stop band. The vertical axis represents the difference in frequency between the open condition and the short circuit condition, while the horizontal axis represents the normalized electrode thickness H/λ. The differences in frequency between the open condition and the short circuit condition in the upper and lower limit modes are defined as ΔFu and ΔFl, respectively. In FIG. 4, it is assumed that the cut angles of the quartz substrate and the surface acoustic wave propagation direction are Euler angles (0°, 123°, 43°) and the normalized electrode width d obtained by dividing the width d of the IDT electrode by the pitch P of the electrode finger of the IDT electrode is η=d/P=0.5.

As shown in FIG. 4, when the reference electrode thickness H/λ is made larger, ΔFl becomes smaller, while ΔFu becomes larger. (Once again what distinction exists if any between "reference electrode" and IDT electrode and why is thickness defined as H/λ and not thickness relative to wavelength as suggested in claim 1 and in paragraph [0010?] Under the above described condition, ΔFu exceeds ΔFl when the reference electrode thickness H/λ is in the range of above 0.0787. That is, when the reference electrode thickness H/λ is in the range of above 0.0787, surface acoustic waves are excited more strongly in the upper limit mode than in the lower limit mode.

Further, it is recognized that even though the reference electrode width η is made larger instead of the normalized electrode thickness H/λ, ΔFl becomes smaller, and ΔFu becomes larger, causing ΔFu to exceed ΔFl in the range of a certain value or more.

Figure 5A:
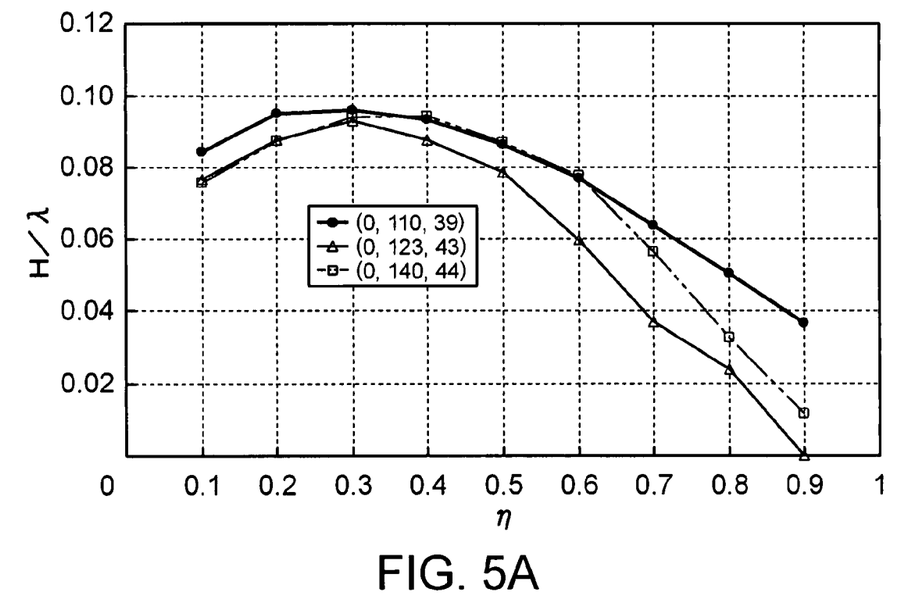
FIG. 5A is a graph showing conditions in which the respective frequency differences in the upper and lower limit modes exceed each other for each of three types of Euler angles.
Figure 5B:
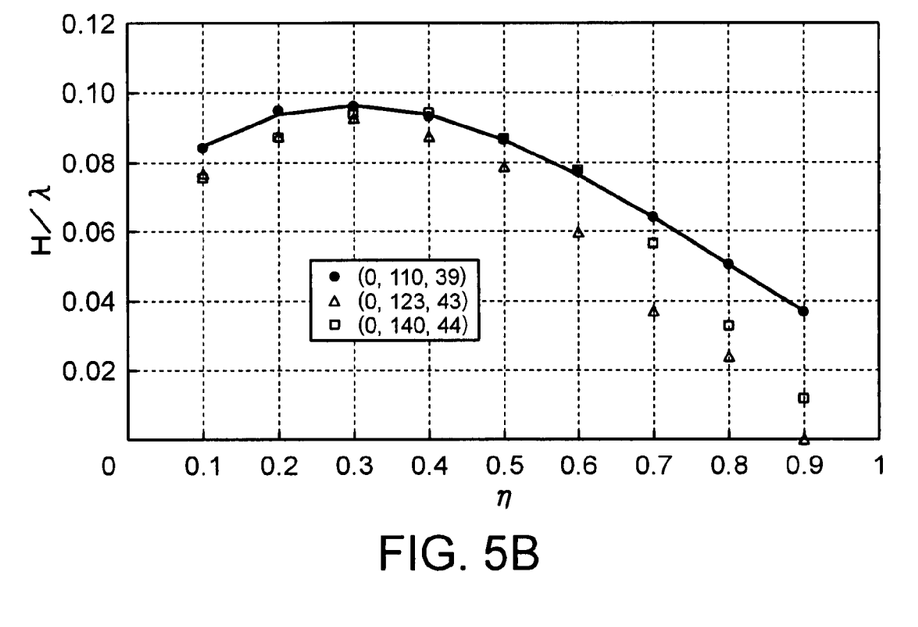
FIG. 5B is a graph showing the boundary satisfying the conditions in which the frequency difference in the upper limit mode exceeds, the frequency difference in the lower limit mode for each of the three types of Euler angles.

FIGS. 5A and 5B show boundary conditions where ΔFu exceeds ΔFl. FIG. 5A is a graph showing boundary points where ΔFu exceeds ΔFl in the cases where the cut angles of the quartz substrate and the surface acoustic wave propagation direction are represented by three types of Euler angles (0°, 110°, 39°), (0°, 123°, 43°), and (0°, 140°, 44°). FIG. 5B is a graph showing a boundary where surface acoustic waves are excited more strongly in the upper limit mode in any of the above described three kinds of quartz substrates. In both graphs, the vertical axis represents the normalized electrode thickness H/λ, and the horizontal axis represents the normalized electrode width η.

In FIG. 5A, ΔFu becomes larger than ΔFl when the normalized electrode thickness H/λ is larger than the values on the boundary line linking the boundary points in each type of quartz substrate. In other words, when the normalized electrode thickness H/λ is made larger than the values on the boundary line, surface acoustic waves are excited more strongly in the upper limit mode.

The boundary line where surface acoustic waves are excited more strongly in the upper limit mode in any of the three types of quartz substrates can be calculated using the following approximate expression.

$$H/\lambda \geqq 0.1796\eta^3 - 0.4303\eta^2 + 0.2071\eta + 0.0682$$

FIG. 5B is what the above described approximate expression is expressed in the form of a graph. From this graph, it is understood that if the approximate expression is satisfied at whichever cut angles the crystal substrate is cut out, the normalized electrode thickness H/λ becomes larger than the boundary line where ΔFu exceeds ΔFl. In other words, when the normalized electrode thickness H/λ and the normalized electrode width η satisfy the approximate expression, it is possible to excite surface acoustic waves more strongly in the upper limit mode using the single-type IDT electrode than in the lower limit mode.

As described above, setting the cut angles of the quartz substrate and the surface acoustic wave propagation direction by Euler angles (0°, 110°≦θ≦140°, 38°≦|ψ|≦44°) and setting the normalized electrode thickness H/λ so that H/λ≧0.1796η³−0.4303η²+0.2071η+0.0682 allows surface acoustic waves to be excited more strongly in the upper limit mode using the single-type IDT electrode than in the lower limit mode. Further, according to this configuration, it is possible to make frequency variations with the temperature smaller than when using an in-plane rotation ST-cut quartz substrate. Furthermore, since this configuration allows the single-type IDT electrode to be used, it is possible to provide a surface acoustic wave device that can readily achieve higher frequencies.

Second Embodiment

Now a second embodiment will be described using as an example an SAW resonator including a reflector on both sides of the single-type IDT electrode described in the first embodiment. Generally, in a surface acoustic wave resonator, surface acoustic waves propagated outward of the IDT electrode are reflected off the reflector so as to trap the surface acoustic wave energy in the IDT electrode section. This makes it possible to obtain a less energy loss resonance characteristic.

Figure 6A:
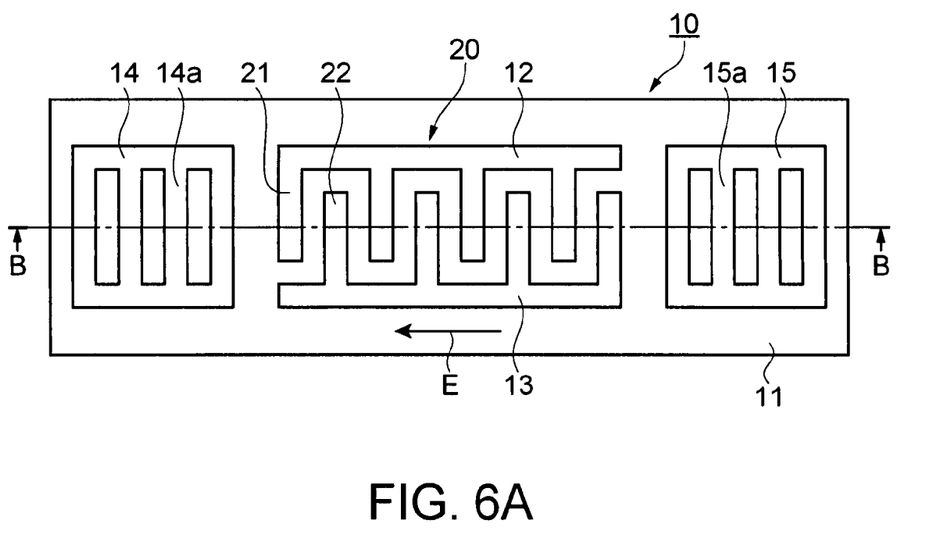
FIG. 6A is a schematic plan view of the SAW resonator.
Figure 6B:
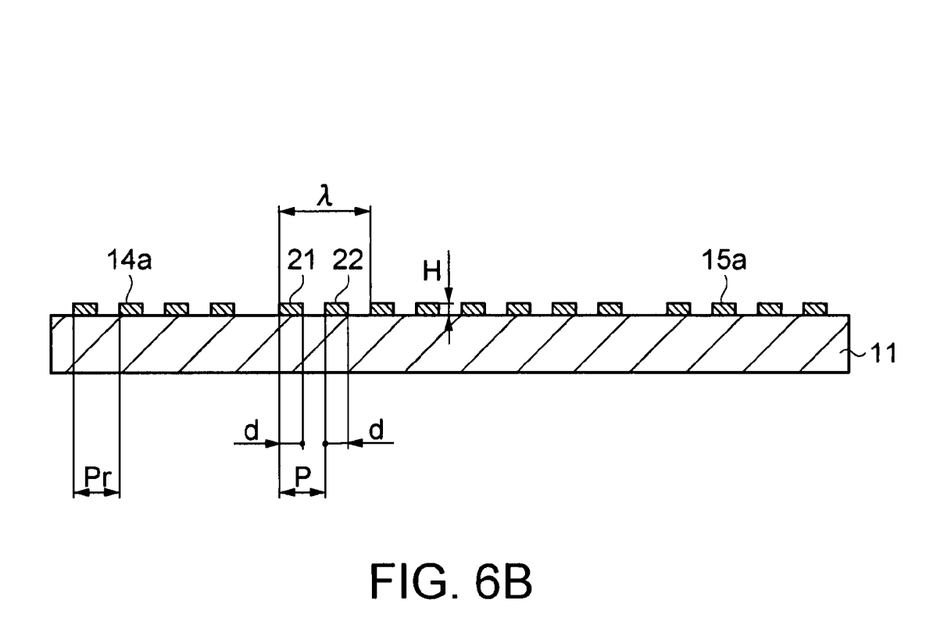
FIG. 6B is a schematic sectional view taken along line B-B of FIG. 6A.

FIGS. 6A and 6B are schematic views of the SAW resonator including the single-type IDT electrode and serving as a surface acoustic wave device; FIG. 6A is a schematic plan view of the SAW resonator, and FIG. 6B is a schematic sectional view taken along line B-B of FIG. 6A. In FIGS. 6A and 6B, the same elements as shown in FIG. 2 are given the same reference numbers.

The SAW resonator 10 has the IDT electrode 20 provided on a surface of the quartz substrate 11 and reflectors 14 and 15 on the sides of the IDT electrode 20. The IDT electrode 20 includes the electrode 12 having the multiple electrode fingers 21 and the electrode 13 having the multiple electrode fingers 22. The electrode fingers 21 and the electrode fingers 22 are disposed as if be engaged with each other and formed in a thickness H and an electrode width d. The pitches P between the electrode fingers 21 and 22 are continuously formed in equal lengths. One electrode finger 21 and one electrode finger 22 are provided in one wavelength λ of a surface acoustic wave. The IDT electrode 20 is composed of Al. The electrode fingers 12 and 13 are driven so as to be in opposite phases. As described in the first embodiment, the normalized electrode thickness H/λ and the normalized electrode width η are set such that H/λ≧0.1796η³−0.4303η²+0.2071η+0.0682.

The reflectors 14 and 15 include plural electrode fingers 14a and 15a, respectively, which are formed of Al. The pitches Pr between the electrode fingers of the reflectors are continuously formed in equal lengths. The quartz substrate 11 is cut out at Euler angles (0°, 110°≦θ≦140°, 38°≦|ψ|≦44°). The direction of the arrow E matches the X' axis that is the surface acoustic wave propagation direction described in FIG. 1.

Generally, in the SAW resonator 10 thus configured, when the pitch P of the IDT electrode 20 and the pitch Pr of the reflectors 14 and 15 have the same size, the peak frequency of the radiation conductance of the IDT electrode 20 and the frequency at the maximum point of the reflection coefficient (absolute value) of the reflectors 14 and 15 are not matched. This means that surface acoustic waves radiated from the IDT electrode 20 cannot be efficiently reflected off the reflectors 14 and 15.

Figure 7A:
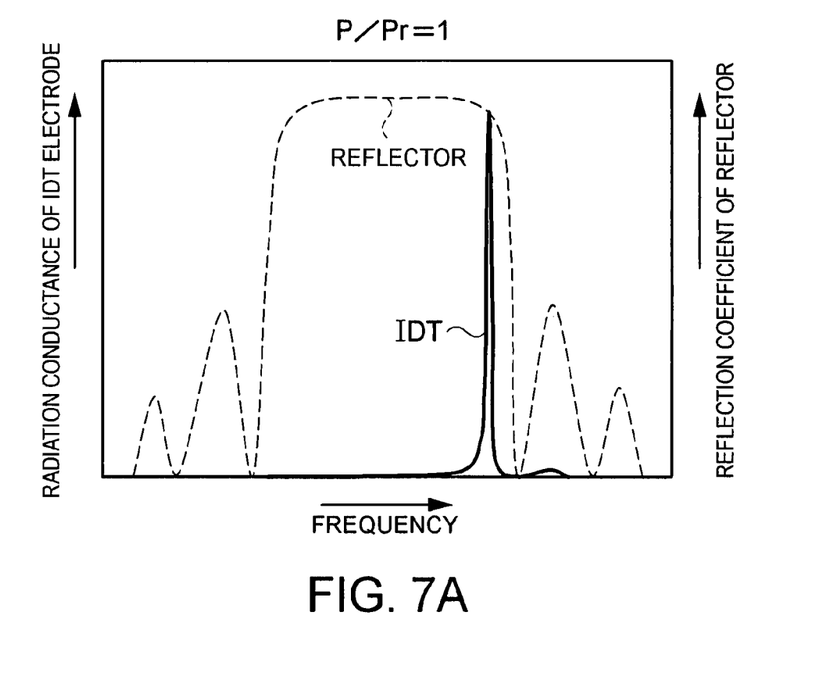
FIGS. 7A and 7B are graphs showing the respective frequency characteristics of the radiation conductance and the reflection coefficient of a reflector in the upper limit mode of the stop band.
Figure 7B:
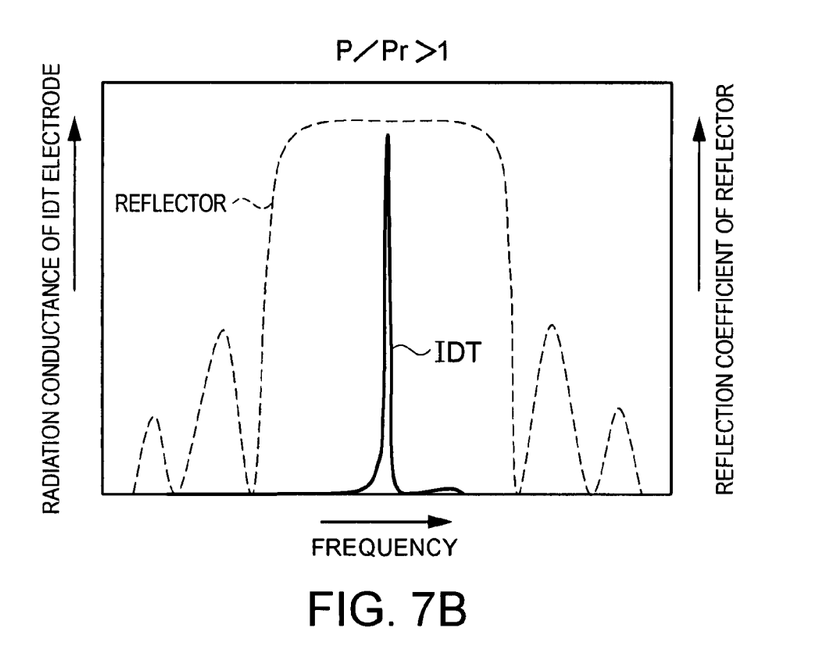

FIGS. 7A and 7B are graphs showing the respective frequency characteristics of the radiation conductance and the reflection coefficient of the reflector in the upper limit mode of the stop band. FIG. 7A is the graph when the pitch P of the IDT electrode and the pitch Pr of the reflector have the same size (P/Pr=1), and FIG. 7A is the graph when the pitch P of the IDT electrode is larger than the pitch Pr of the reflector (P/Pr>1).

Figure 8A:
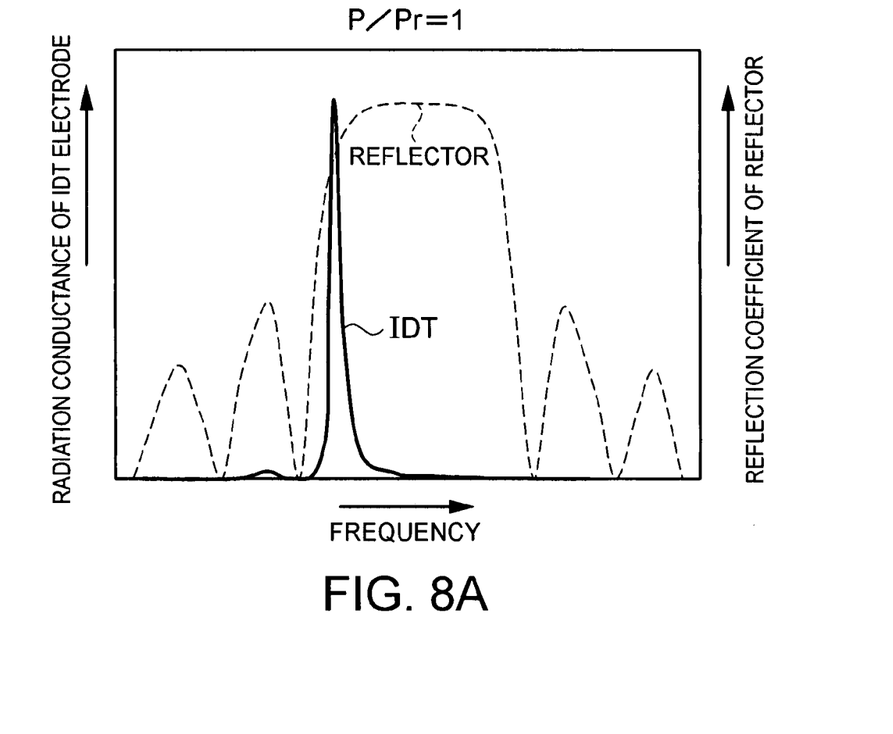
FIGS. 8A and 8B are graphs showing the respective frequency characteristics of the radiation conductance and the reflection coefficient of a reflector in the lower limit mode of the stop band.
Figure 8B:
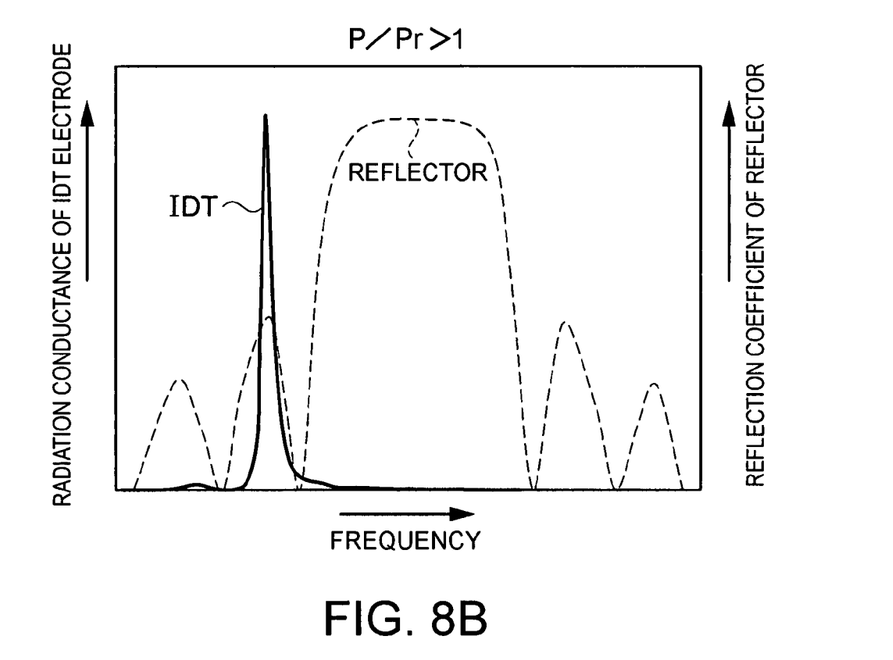

FIGS. 8A and 8B are graphs showing the respective frequency characteristics of the radiation conductance and the reflection coefficient of the reflector in the lower limit mode of the stop band. FIG. 8A is a graph when the pitch P of the IDT electrode and the pitch Pr of the reflector have the same size (P/Pr=1), and FIG. 8A is a graph when the pitch P of the IDT electrode is larger than the pitch Pr of the reflector (P/Pr>1).

As shown in FIG. 7A, when P/Pr=1, the peak frequency of the radiation conductance in the upper limit mode of the stop band appears as a higher frequency than the frequency at the maximum point of the reflection coefficient (absolute values)

of the reflector. As shown in FIG. 7B, when P/Pr>1, the peak frequency of the radiation conductance of the IDT electrode is lowered and comes close to the frequency at the maximum point of the reflection coefficient of the reflector. This causes the IDT electrode to excite surface acoustic waves more strongly.

On the other hand, as shown in FIG. 8A, when P/Pr=1, the peak frequency of the radiation conductance in the lower limit mode of the stop band appears as a lower frequency than the frequency at the maximum point of the reflection coefficient (absolute value) of the reflector. As shown in FIG. 8B, when P/Pr>1, the peak frequency of the radiation conductance of the IDT electrode is lowered and moves away from the frequency at the maximum point of the reflection coefficient of the reflector. Therefore, surface acoustic waves are not excited more strongly in the lower limit mode.

In general, providing reflectors to an IDT electrode is intended to reduce the logarithms of the IDT electrode. Thus, there is little reflection in the lower limit mode, causing surface acoustic waves to be excited weakly in the lower limit mode.

As described above, specifying the cut angles of the quartz substrate and the normalized electrode thickness H/λ as described in the first embodiment allows surface acoustic waves to be excited more strongly in the upper limit mode than in the lower limit mode. Further, designing the IDT electrode so that the pitch P of the IDT electrode is larger than the pitch Pr of the reflector (P/Pr>1) allows surface acoustic waves to be excited even more strongly only in the upper limit mode of the stop band.

Third Embodiment

Figure 9:
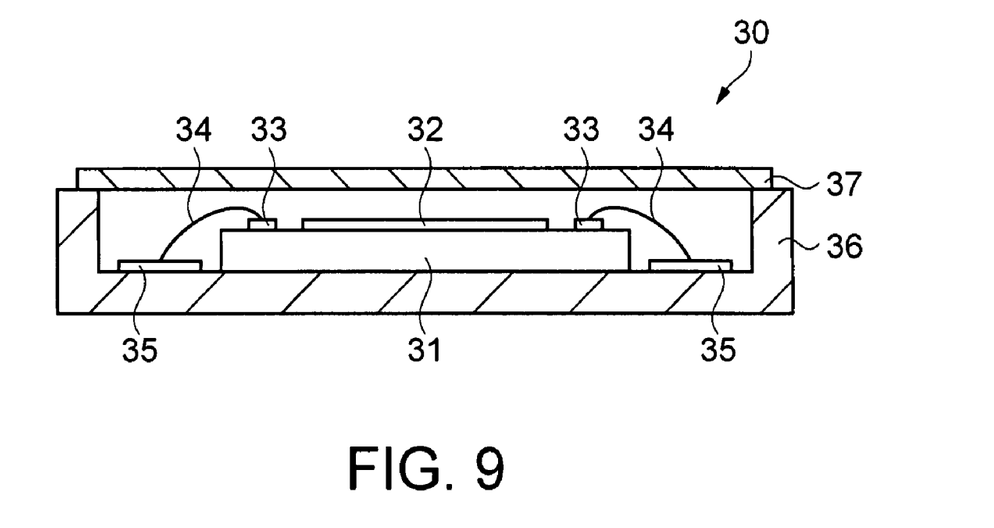
FIG. 9 is a sectional view partially showing a packaged SAW resonator serving as a third embodiment of the invention.

FIG. 9 is a partial sectional view of an embodiment in which the SAW resonator serving as a surface acoustic wave device described in the first or second embodiment is packaged. An SAW resonator 31 is housed in a container 36 in such a manner that the SAW resonator 31 is fixed to the inside of the container 36. On the SAW resonator 31, a single-type IDT electrode 32 and a connection pad 33 to be connected to the single-type IDT electrode 32 are formed. The connection pad 33 on the SAW resonator 31 is electrically connected to a connection terminal 35 formed in the container 36 via a wire 34 made of Au. A lid 37 is put on the container 36 to keep the interior of the container 36 in a pressured-reduced atmosphere or an inert gas atmosphere. Thus, a packaged SAW resonator 30 is configured.

As described above, according to this embodiment, it is possible to obtain the packaged SAW resonator 30 that uses the single-type IDT electrode and utilizes the upper limit mode of the stop band. This packaged SAW resonator 30 has the excellent frequency temperature characteristic and can achieve higher frequencies, allowing use in a variety of electronic apparatuses.

Fourth Embodiment

Figure 10:
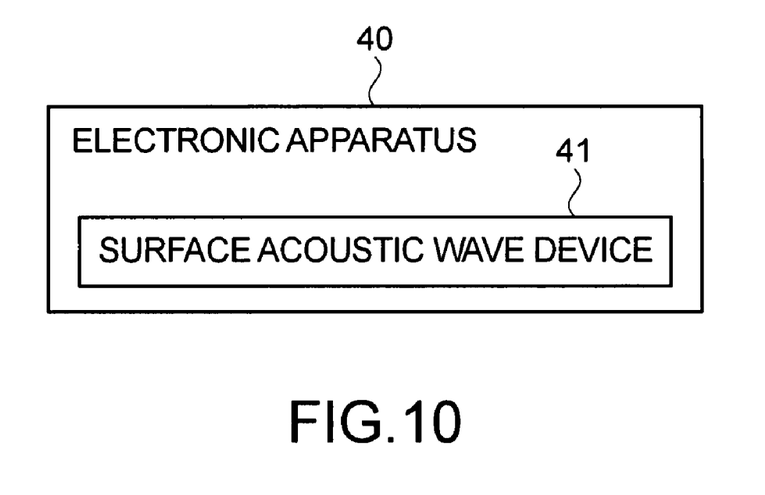
FIG. 10 is a drawing the configuration of an electronic apparatus serving as a fourth embodiment of the invention.

FIG. 10 is a block diagram showing the configuration of an electronic apparatus according to the invention. An electronic apparatus 40, typified by a cellular phone or navigation system, is provided with an SAW resonator capable of achieving higher frequencies serving as a surface acoustic wave device 41 according to the present invention. The SAW resonator has the excellent frequency temperature characteristic and can achieve higher frequencies, so it is possible to obtain the electronic apparatus 40 having an excellent characteristic.

The surface acoustic wave device has heretofore been described using the SAW resonator as an example. Since resonator-type surface acoustic wave filters utilize the stop band edge resonance, it is possible to configure an SAW filter using a similar technique to that used in the SAW resonator. Therefore, it is possible to obtain an SAW filter that can exhibit the excellent frequency temperature characteristic and readily achieve higher frequencies by using the upper limit mode.

What is claimed is:

1. A surface acoustic wave device, comprising:
a quartz substrate; and
at least a single-type IDT electrode having a plurality of electrode fingers provided on a surface of the quartz substrate for exciting a Rayleigh surface acoustic wave in the upper limit mode of the surface acoustic wave stop band with
the following relationships being satisfied;

$$\phi=0°, 110°\leq\theta\leq140°, \text{ and } 38°\leq|\psi|\leq44°,$$

when the quartz substrate has cut angles, a surface acoustic wave propagation direction represented by Euler angles ($\phi$, $\theta$, $\psi$), and an electrode thickness relative to wavelength, set such that $$H/\lambda \geq 0.1796\eta^3 - 0.4303\eta^2 + 0.2071\eta + 0.0682,$$

wherein the thickness of the IDT electrode is defined as H, the width of an electrode finger of the IDT electrode is defined as d, the pitch between the electrode fingers of the IDT electrode is defined as P, the wavelength of the surface acoustic wave is defined as λ, and where η=d/P; and with the surface acoustic wave device further comprising:

a reflector having electrode fingers on both sides of the IDT electrode in a relationship with the electrode fingers of the IDT electrode as follows: P/Pr>1, where P defines the pitch between the electrode fingers of the IDT electrode and Pr defines the pitch between the electrode fingers of the reflector.

2. An electronic apparatus including a
surface acoustic wave device, comprising:
a quartz substrate; and
at least a single-type IDT electrode having a plurality of electrode fingers provided on a surface of the quartz substrate for exciting a Rayleigh surface acoustic wave in the upper limit mode of the surface acoustic wave stop band with
the following relationships being satisfied;

$$\phi=0°, 110°\leq\theta\leq140°, \text{ and } 38°\leq|\psi|\leq44°,$$

when the quartz substrate has cut angles, a surface acoustic wave propagation direction represented by Euler angles ($\phi$, $\theta$, $\psi$), and an electrode thickness relative to wavelength set such that $$H/\lambda \geq 0.1796\eta^3 - 0.4303\eta^2 + 0.2071\eta + 0.0682,$$

wherein the thickness of the IDT electrode is defined as H, the width of an electrode finger of the IDT electrode is defined as d, the pitch between the electrode fingers of the IDT electrode is defined as P, the wavelength of the surface acoustic wave is defined as λ, and where η=d/P and with the surface acoustic wave device further comprising a reflector having electrode fingers on both sides of the IDT electrode in a relationship with the electrode fingers of the IDT electrode as follows: P/Pr>1, where P defines the pitch between the electrode fingers of the IDT electrode and Pr defines the pitch between the electrode fingers of the reflector.

* * * * *